United States Patent [19]
Chandler, Jr.

[11] Patent Number: 5,843,322
[45] Date of Patent: Dec. 1, 1998

[54] PROCESS FOR ETCHING N, P, N+ AND P+ TYPE SLUGS AND WAFERS

[75] Inventor: Thomas C. Chandler, Jr., Roebuck, S.C.

[73] Assignee: MEMC Electronic Materials, Inc., St. Peters, Mo.

[21] Appl. No.: 779,976

[22] Filed: Dec. 23, 1996

[51] Int. Cl.⁶ ..................................... B44C 1/22
[52] U.S. Cl. ................... 216/85; 438/16; 216/99
[58] Field of Search .................... 438/753, 745, 438/14, 16; 216/84, 85, 99

[56] References Cited

U.S. PATENT DOCUMENTS

| | | | |
|---|---|---|---|
| 3,756,877 | 9/1973 | Muraoka et al. | 45/86 |
| 3,966,517 | 6/1976 | Claes et al. | 156/7 |
| 3,977,926 | 8/1976 | Johnson, Jr. et al. | 156/17 |
| 4,187,140 | 2/1980 | Berkenblit et al. | 156/662 |
| 4,508,757 | 4/1985 | Fabricius et al. | 427/93 |
| 4,746,397 | 5/1988 | Maeda et al. | 156/637 |
| 4,787,997 | 11/1988 | Saito et al. | 252/79.4 |
| 5,266,152 | 11/1993 | Iwasaki et al. | 156/626 |
| 5,340,437 | 8/1994 | Erk et al. | 156/639 |
| 5,346,557 | 9/1994 | Ito et al. | 134/10 |
| 5,474,644 | 12/1995 | Kato et al. | 156/345 |
| 5,496,485 | 3/1996 | Maternaghan | 252/79.3 |
| 5,501,766 | 3/1996 | Barbee et al. | 156/627.1 |

FOREIGN PATENT DOCUMENTS

| | | |
|---|---|---|
| 2013830 | 10/1971 | Germany. |
| 58-037178 | 3/1983 | Japan. |
| 2089315 | 3/1990 | Japan. |

OTHER PUBLICATIONS

Thomas C. Chandler, Jr., An Investigation into the Development of Etchants for the Delineation of Structural Imperfections by Pit or Hillock Formation (1993).

Primary Examiner—R. Bruce Breneman
Assistant Examiner—George Goudreau
Attorney, Agent, or Firm—Senniger, Powers, Leavitt & Roedel

[57] ABSTRACT

A process for etching single crystal silicon semiconductor material of the N, P, N+ and P+ type slugs and wafers to delineate slip, lineage, dislocation, S-pit, twins, swirl and oxidation induced stacking fault defects involves the steps of:
a) preparing a substantially metal-free etchant bath comprising nitric acid (70%), hydrofluoric acid (49%) and between approximately 35% to 98% by weight of glacial acetic acid (HAc) as a diluent, the minimum useful concentration of nitric acid being % Nitric acid$_{min.}$=16.67[1-(% HAc/100)] and the maximum useful concentration of nitric acid being % Nitric acid$_{max.}$=66.67[1-(% HAc/100)], the minimum useful concentration of hydrofluoric acid being % HF$_{min.}$=100%-% HAc % HNO$_{3\ max.}$ and the maximum useful concentration of hydrofluoric acid being % HF$_{max.}$-100%-% HAc-HNO$_{2min.}$
b) activating the etchant bath by generating NO$_x$ therein and allowing the temperature of the bath to rise to approximately 25° to 34° C.;
c) brining the semiconductor material in a clean and damage-free condition into contact with the bath maintained at the said temperature;
d) agitating the bath by bubbling an inert gas therethrough and maintaining the semiconductor material in contact with the resultant agitated bath and for a period of time sufficient to remove at least approximately 0.5 micron of silicon therefrom; and
e) quenching the resultant etching of the semiconductor material by rinsing with water.

12 Claims, 2 Drawing Sheets

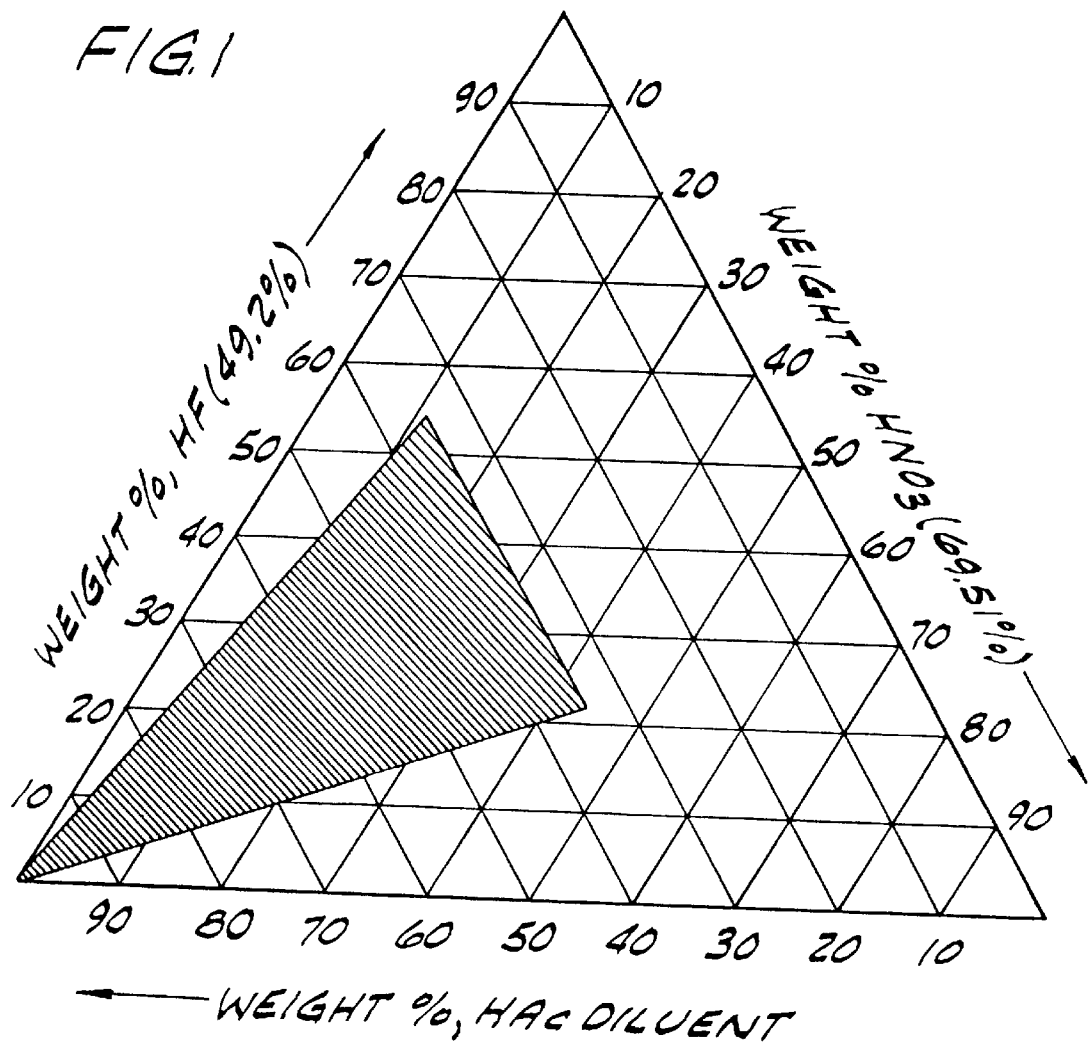

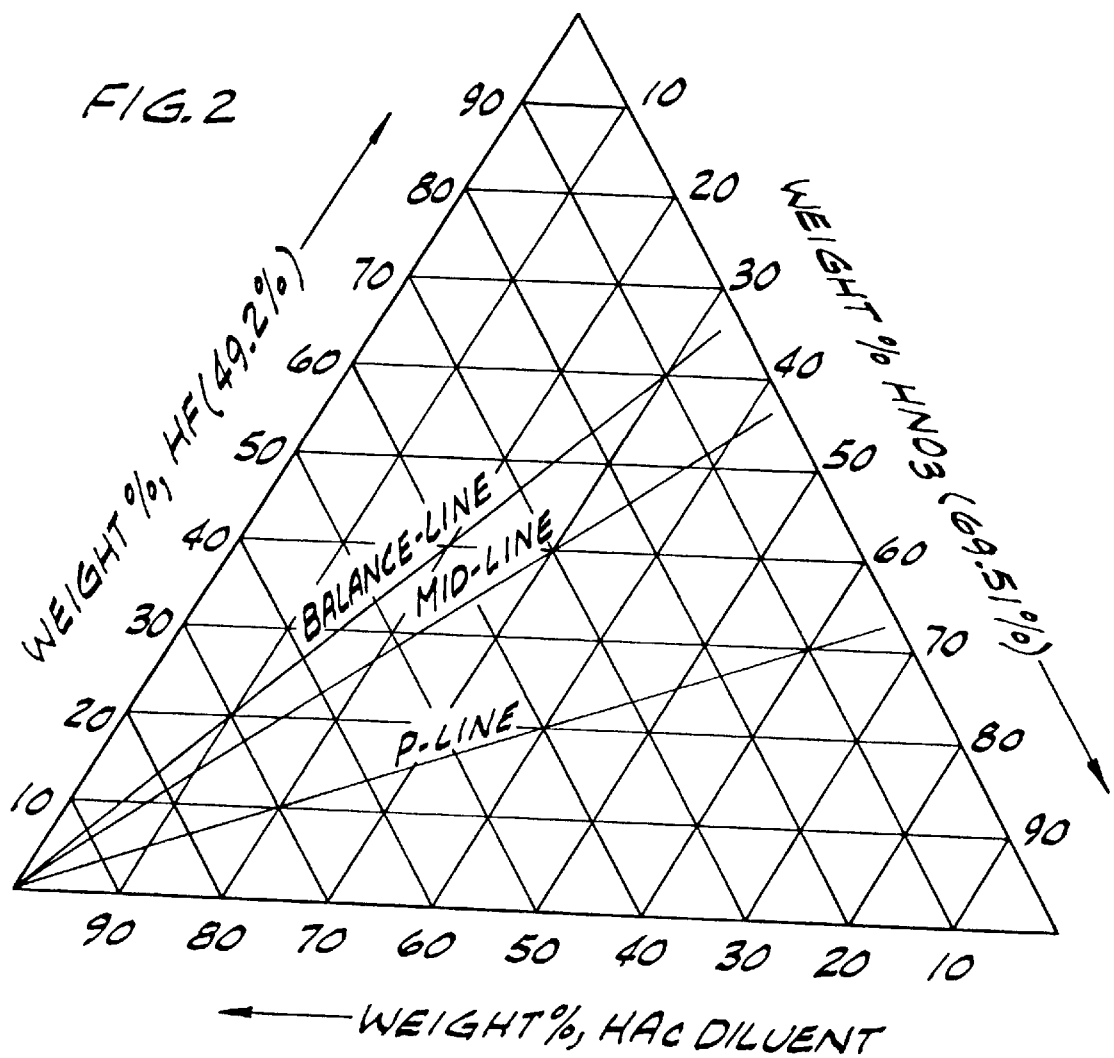

PROCESS FOR ETCHING N, P, N+ AND P+ TYPE SLUGS AND WAFERS

BACKGROUND OF THE INVENTION

This invention relates to a process for etching single crystal silicon slugs and wafers of the N, P, N+ and P+ type and, more particularly, to such a process which employs a metal-free etchant composition.

As is known, structural defects are detrimental to silicon wafer and slug performance and quality. The preferred existing etchants used to delineate slip, dislocations, swirl, stacking faults, S-pits and other less common defects on silicon wafers and slug samples contain chromium compounds which are known carcinogens. Etchants have been developed in which copper salts are substituted for chromium compounds. While these etchant formulas perform within expected limits, the presence of a copper salt is harmful to waste water treatment systems and presents a significant environmental hazard as a result. (Chandler, T. C., J. Electrochem. Soc., vol. 137, pp. 944, 1990).

Other etchants which are metal-free have been developed. Among these may be noted the following formulas set forth in weight %:

| Etchant | % HF (49%) | % HNO$_3$ (70%) | % HAc | % water | Metal Salt |
|---|---|---|---|---|---|
| Dash 1 | 8.63 | 30.62 | 60.75 | 0 | none |
| Dash 2 | 4.51 | 16.03 | 79.45 | 0 | none |
| Schimmel | 99.49 | 0 | 0 | 0.5 | none |
| Sato 1 | 4.59 | 69.92 | 12.13 | 14.26 | none |
| Sato 2 | 4.26 | 64.08 | 11.26 | 20.39 | none |
| Sato 3 | 4.44 | 66.69 | 3.91 | 24.96 | none |
| Sato 4 | 8.39 | 63.08 | 7.39 | 21.13 | none |

Each of these etchants has serious deficiencies that limit their use. The Dash etchants etch very slowly, are not practical in a manufacturing environment and do not yield uniform results for all silicon wafer orientations. The Schimmel etchant, while faster than the Dash etchants, does not work equally well for all orientations and resistivities. The Sato etchants present a problem in that a large number of solutions are needed to cover all the different silicon products and they do not work well for heavily doped silicon products. Moreover, the use of each of the above-noted etchants involves rate limited reactions in the etching mechanism.

There remains a need, therefore, for an improved etching process for N, P, N+ and P+ type silicon slugs and wafers which employs substantially metal-free etchant compositions and which can be fine tuned to accommodate the etchant composition employed as well as optimize performance for the specific silicon product or defect of interest.

SUMMARY OF THE INVENTION

Among the objects of the invention may be noted an improved process for etching standard N, P, N+ and P+ type silicon slugs and wafers; the provision of such a method which employs a substantially metal-free etchant composition; the provision of a process which permits delineation of slip, lineage, grain boundary, dislocation, S-pit and twins defects in N, P, N+ and P+ type silicon slugs and wafers; and the provision of a process of this type which optimizes performance for the delineation of specific defects. Other objects and features of this invention will be in part apparent and in part pointed out hereinafter.

Briefly, the present invention is directed to a process for etching single crystal silicon semiconductor slugs and wafers of the N, P, N+ and P+ type to delineate slip, lineage, grain boundary dislocation, S-pit, twins, swirl and oxidation induced stacking fault defects which comprises the steps of:

a) preparing a substantially metal-free etchant bath comprising nitric acid (70%), hydrofluoric acid (49%) and glacial acetic acid having proportions within the shaded area of the ternary diagram of FIG. 1;

b) activating the etchant bath by generating NO$_x$ therein and allowing the temperature of the bath to rise to approximately 25° to 34° C.;

c) bringing the slugs or wafers in a clean and damage-free condition into contact with the bath maintained at such temperature;

d) agitating the bath by bubbling an inert gas therethrough and maintaining the slugs or wafers in contact with the resultant agitated bath and for a period of time sufficient to remove approximately 0.5 micron of silicon therefrom; and e) quenching the resultant etching of the slugs or wafers by rinsing them with water.

BRIEF DESCRIPTION OF THE DRAWINGS

FIG. 1 is a ternary diagram showing within the shaded area the family of etchant composition formulas useful in the present invention for the ternary HF-HNO$_3$-HAc system; and FIG. 2 is a ternary diagram showing the balance line, mid-line and P-line etchant composition formulas useful in the present invention for the ternary HF-HNO$_3$-HAc system.

DESCRIPTION OF THE PREFERRED EMBODIMENTS

In accordance with the present invention, it has now been found that an improved process for etching semiconductor silicon slugs or wafers of the N, P, N+ and P+ type to delineate slip, lineage, grain boundary, dislocation, S-pit, twins, swirl and oxidation induced stacking fault defects is provided by utilizing certain autocatalytic process conditions and a substantially metal-free etchant bath composition. Referring to FIG. 1, a ternary diagram is presented showing within the shaded area the family of etchant composition formulas useful in the present invention, these compositions comprising hydrofluoric acid (49.2%), nitric acid (69.51%) and glacial acetic acid (HAc) as a diluent. Formulas which lie outside the shaded area of FIG. 1 tend to be sensitive to variation in hydrofluoric acid concentration and are etchant compositions of limited utility. The range of compositions encompassed by the shaded area of FIG. 1 is the autocatalytic region of the hydrofluoric acid (49%), nitric acid (70%) and glacial acetic acid ternary system where the acetic acid (HAc) diluent constitutes approximately 35% to 98% by weight, the minimum useful concentration of nitric acid is % Nitric acid=16.67[1-(% HAc/100)]

and the maximum useful concentration of nitric acid is

% Nitric acid=66.67[1-(% HAc/100)]

As will be evident from FIG. 1, there are many possible etchant formulas lying within the shaded area, but the preferred formulas for use in the present invention lie on or near the midline as shown in FIG. 2. FIG. 2 shows the midline where the formulas are given in weight percent as $$\frac{\text{wt. \% HF (49\%)}}{\text{wt. \% HNO}_3\text{ (70\%)}} = 1.333 \,(\pm 0.2)$$

and the diluent is glacial acetic acid (HAc). Other useful formulas are also found on adjacent lines of FIG. 2. Thus, the "balance" line formulas have etch rates very similar to the midline formulas, but are more preferential and tend to favor N type material when the resistivity is low. The ratio of HF to HNO$_3$ for the balance line formulas is represented by $$\frac{\text{wt. \% HF (49\%)}}{\text{wt. \% HNO}_3\text{ (70\%)}} = 2.040 \,(\pm 0.2)$$

In general, adjusting the formulas within the shaded area of FIG. 1 to be closer to the balance line improves the preferential behavior of the etch formula. In order to keep the etch rate constant, an etchant formula should stay on the same diluent contour or line in FIGS. 1 or 2. Adjusting the formulas left or right on a constant HF contour or line in FIGS. 1 or 2 away from the balance line reduces the etch rate. Moving the formula in FIGS. 1 or 2 down toward the apex on a constant HNO$_3$ contour or line also reduces the etch rate. FIG. 2 also shows a P-line for formulas which lie on the lower boundary of the HNO$_3$ tolerant zone. The P-line formulas are preferably used on P+ material and yield a rough surface for N+ material. With P-line formulas, the pits and other etch figures tend to be smaller than with the midline formulas and etch times tend to be very long. The ratio of HF to HNO$_3$ for the P-line formulas is represented by $$\frac{\text{wt. \% HF (49\%)}}{\text{wt. \% HNO}_3\text{ (70\%)}} = 0.490 \,(\pm 0.2)$$

The preferred etchant formula for use in the present invention has the following composition:

|  | By Wt. |
| --- | --- |
| Hydrofluoric acid (49%) | 20% (±0.5) |
| Nitric acid (70%) | 20% (±1.0) |
| Glacial acetic acid | 60% (±1.0) |

This composition is preferred for use if pit size and shape are not important in carrying out the etching process. Also useful in the practice of the present invention is an etchant having the following composition:

|  | By Wt. |
| --- | --- |
| Hydrofluoric acid (49%) | 26.847% (±0.5) |
| Nitric acid (70%) | 13.153% (±1.0) |
| Glacial acetic acid | 60.000% (±1.0) |

This composition is preferred where pit size and shape are important or if twinning is a problem for the standard N or P type slugs being etched.

It will be understood that other formulas within the shaded are of the ternary diagram of FIG. 1 may also be used in carrying out the process of the invention.

The process of the present invention is useful for etching single crystal silicon semiconductor slugs of the N. P, N+ and P+ type to delineate slip, lineage, grain boundary dislocation, S-pit, twins, swirl and oxidation induced stacking fault (OISF) defects. The slugs may be, for example, of the <100>, <111>, <511>, or <110> orientation. The process is applicable for all product diameters, and the slugs to be etched must be clean and damage-free as determined by ASTM F47.

The process of the present invention is also useful for etching single crystal silicon semiconductor wafers of the N, P, N+ and P+ type to delineate slip, lineage, dislocation, S-pit, twins, swirl, oxidation induced stacking faults, fog, unfaulted loops, dislocation networks and vacancy related artifacts defects. The wafers may be, for example, of the <100>, <111>, <511> or <110> orientation. The process is applicable for all product diameters in addition to EB, EG, BSD or oxidized EPI surface treatments. The wafers to be etched must be clean and damage-free as determined by ASTM F47.

In carrying out the process of the present invention, the etchant bath is activated by generating NO$_x$ (nitrous oxide) therein. In accordance with the invention, the etchant bath must be saturated with NO$_x$ in order for defect etching to proceed. Nitrous oxide is the catalyst in the etching reaction and must be present in sufficient quantity to promote the etching process. The autocatalytic etching process or reaction proceeds in two phases. In the first phase, a boundary layer forms on the silicon surface and the concentration of NO$_x$ (catalyst) and nitrous acid (oxidizing agent) build up. When the concentrations of these two reactants reach their critical limit near the silicon surface, the system flashes over to the second phase characterized by a substantial increase in the etch rate and the generation of visible amounts of nitrous oxide. Preferably, the concentration of NO$_x$ in the etchant bath is at a level that will sustain a constant etch rate over the period of time desired.

In accordance with the invention, activation of the etchant bath or the generation of NO$_x$ is accomplished by adding a known quantity of nitrate ions to the bath or by the addition of scrap silicon to the bath. A source of nitrate ions such as an alkali metal nitrate (e.g. sodium nitrate) may be conveniently used for the purpose of activation, and advantageously generates NO$_x$ without depleting the nitric acid component of the bath. Alternatively, scrap silicon may be employed and reacts with nitric acid in the etchant bath to produce NO$_x$. This reaction is exothermic and causes the bath temperature to rise, the rise in temperature being a function of the amount of NO$_x$ generated. In general, the lower the degree of activation, the lower the rate of etching but the etching process is both temperature and etchant composition dependent.

In the practice of the invention, the etchant bath is activated by generating NO$_x$ therein and the temperature of the bath is allowed to rise to approximately 25° to 34° C. This temperature rise can be accomplished through the generation of NO$_x$ by an exothermic reaction and/or by external heat applied to the bath. The slugs or wafers in a clean and damage-free condition are then brought into contact with the bath maintained at a temperature within the range 25° to 34° C.

In further accordance with the invention, the bath is agitated by bubbling an inert gas therethrough while maintaining the slugs or wafers in contact with the agitated bath and for a period of time sufficient to remove at least 0.5 microns of silicon therefrom. Under these conditions of activation, temperature and intense agitation, the agitation breaks up the boundary layer that forms during the flashover or induction phase of the etching process and slows the etch rate thereby forcing the etch cycle to proceed in the preflashover mode. During this agitated preflashover cycle, the silicon may form a thin layer of silicon suboxide, but because the flashover event is circumvented, this layer is not removed and simply accumulates as an oxide-like layer. A film or layer build-up is unlikely for typical etch times in the case of N+ or P+ slugs or wafers, but if it occurs, a brief stripping in a potassium permanganate/hydrofluoric acid solution will easily remove it.

Agitation is achieved by bubbling an inert gas such as nitrogen or one of the noble gases (e.g. helium) through the bath. The inert gas may be bubbled through the bath at a rate sufficient to impart intense agitation, i.e. a rate of approximately 5–20 CFH at a constant pressure of 15–30 psi, preferably at a rate of 10–15 CFH at a constant pressure of 30 psi. Rotation of the slugs or wafers during etching is preferred.

The etching is carried out for a period of time sufficient to remove at least approximately 0.5 microns of silicon from the slugs or wafers and preferably 1.5 microns of silicon in the case of wafers. The specific etching time and specific temperature employed will vary depending upon the type of slug or wafer being etched and the etchant bath composition being used. For example, for slugs or wafers of the N, P, N+ and P+ type and an etchant bath composition comprising 20 wt. % (±0.5) hydrofluoric acid, 20 wt. % (±1.0) nitric acid and 60 wt. % (±1.0) glacial acetic acid, the etching time is approximately 2.5 or 5 minutes at a bath temperature of 31° to 32° C. Where slugs of this type are being etched and the defect delineated is swirl, the etching time may be, for example, approximately 5 minutes whereas the etching time may be 2.5 minutes where the defect delineated is oxidation induced stacking fault (OISF). Other etchant bath compositions falling within the shaded area of the ternary diagram of FIG. 1 or on or adjacent the midline and balance line of FIG. 2 may also be used in the practice of the invention with the preferred temperature within the range of 25° to 34° C. and the etching time required to remove at least approximately 0.5 microns of silicon from slugs or wafers being etched being readily determinable.

After the slugs or wafers have been etched for a sufficient period of time to remove approximately 0.5 microns of silicon therefrom as described above, the etching is quenched by rinsing the slugs or wafers with water. In order to remove the suboxide layer or film previously mentioned, the etched slugs or wafers may be stripped in a potassium permanganate/hydrofluoric acid solution. As shown by the examples set forth hereinafter, the process of the invention provides results comparable to those obtained with chromic acid etchants and more easily delineates metallic haze.

The following examples illustrate the practice of the invention.

EXAMPLE 1

Using a 28 liter etch bath, 75 P<100> slugs in the resistivity range of 8 to 14 ohm-cm were etched in groups of 16 slugs on five consecutive days to simulate an actual wafer evaluation schedule. These "seed-end" slugs were selected from ingots already known to have swirl per previous testing by the accepted method (ASTM F47 and DIN 50434) using chromic acid etchant. Five slugs with no structural effects were included as controls. The slugs were clean and damage-free per ASTM F47 and JEIDA JIS-H-0609. The slugs were subjected to an 1100 degree dry-wet-dry oxidation cycle necessary to nucleate the swirl defect.

An etchant bath having the following composition was prepared:

| | |
|---|---|
| Hydrofluoric acid (49%) | 20.000 wt. % (±0.5) |
| Nitric acid (70%) | 20.000 wt. % (±1.0) |
| Glacial acetic acid | 60.000 wt. % (±1.0) |

The bath was activated by adding scrap silicon thereto generating $NO_x$ and causing the bath temperature to rise. The slugs were etched in the activated etchant bath for 5 minutes at a temperature of 31° to 32° C. During etching, intense agitation of the etchant bath was accomplished by a nitrogen sparge with a flow rate of 10 CFH at a constant pressure of 30 psi. Etching was quenched by rinsing the slugs with water.

The etching resulted in a nominal removal of 1.5 microns on both faces for a total change in slug thickness of 3 microns. The etching resulted in a specular surface suitable for visual inspection by high intensity lamp. The slugs displayed no significant surface stains, haze or other interference. All slugs know to be defective displayed swirl rings visible under high intensity lamps. The control slugs displayed no trace of swirl although numerous random stacking faults were seen. The size, location and defect density of the swirl rings varied over the normal range for the product and all were clearly discernible regardless of variation. Some slugs previously tested with chromic acid etchant and believed to be free of defects, displayed narrow, sparsely populated swirl rings after the etching of this example, indicating improved performance over the chromic acid etching method.

EXAMPLE 2

Using a 28 liter etch bath, 150 slugs in resistivity range of 1 to 60 ohm-cm were etched in groups ranging in size from 2 to 15 slugs, one to two runs per day for ten days. The slugs covered the entire product range, i.e. 4, 5 and 6 inch diameter, <100> and <111> orientation and both P and N type. The slugs were clean and damage-free per ASTM F47 and JEIDA JIS-H-0609. The slugs were subjected to an 1100 degree dry-wet-dry oxidation cycle necessary to nucleate the swirl defect.

The etchant bath of Example 1 was employed and was activated by adding scrap silicon thereto to generate $NO_x$. This caused the temperature to rise and the slugs were etched for 5 minutes at a temperature of 31° to 32° C. During etching, intensive agitation of the etchant bath was accomplished by a nitrogen sparge with a flow rate of 10 CFH at a constant pressure of 30 psi. Etching of the slugs was quenched by rinsing them with water.

The etching resulted in a nominal removal of 1.5 microns on both faces for a total change in slug thickness of 3 microns. The swirl defect rate was normal for this current product line and consistent with previous experience with chromic acid etchants. The etching resulted in a specular surface suitable for visual inspection by high intensity lamp. The slugs displayed no significant surface stains, haze or other interference. Stacking faults were clearly visible on these slugs. The size, location and defect density of the swirl rings varied over the normal range for the product and all were clearly discernible regardless of the variation.

EXAMPLE 3

Using a 28 liter etch bath, 75 P<100> slugs in the resistivity range of 8 to 14 ohm-cm were etched in groups of 16 (15 slugs and 1 control wafer) on five consecutive days to simulate an actual wafer evaluation schedule. Wafers were selected from ingots already known to have high oxidation induced stacking faults (OISF) per previous testing by the accepted method (ASTM F47 and DIN 50434) using chromic acid etchant. The 5 wafers were included as controls. The slugs were clean and damage-free per ASTM F47 and JEIDA JIS-H-0609. The slugs and control wafers were subjected to an 1100 degree dry-wet-dry oxidation cycle necessary to generate oxidation induced stacking faults.

The etchant bath of Example 1 was employed and was activated by adding scrap silicon thereto to generate $NO_x$. This caused the temperature to rise and the slugs were etched for 5 minutes at 31° to 32° C. During etching, intense agitation was accomplished by a nitrogen sparge with a flow rate of 10 CFH at a constant pressure of 30 psi. Etching of the slugs was quenched by rinsing them with water.

The etching resulted in a nominal removal of 1.5 microns on both faces for a total change in slug thickness of 3 microns. The etching resulted in a specular surface suitable for visual inspection by high intensity lamp. The slugs displayed no significant surface stains, haze or other interference. The control wafers (known to be defective) displayed OISF at the expected level, visible under high intensity lamps. The size, location and defect density of the OISF varied considerably. Most of the product displayed average counts between 2 and 10 defects/cm$^2$ with a standard deviation of 15, while some slugs displayed average counts between 20 and 50 defects/cm$^2$. After closer examination it was clear that the slugs with high counts were the result of poor handling and preparation. These results are similar to those seen with chromic acid etching.

EXAMPLE 4

Using a 28 liter etch bath, 150 slugs in the resistivity range of 1 to 60 ohm-cm were etched in groups ranging in size from 5 to 15 slugs, one to two runs per day for ten days. The slugs covered the entire product range, i.e. 4, 5 and 6 inch diameter, <100> and <111> orientation, and both P and N type. The slugs were clean and damage-free per ASTM F47 and JEIDA JIS-H-0609. The slugs were subjected to an 1100 degree dry-wet-dry oxidation cycle necessary to generate OISF.

The etchant bath of Example 1 was employed and was activated by adding scrap silicon thereto to generate $NO_x$. This caused the temperature to rise and the slugs were etched for 5 minutes at 31° to 32° C. During etching, intense agitation was accomplished by a nitrogen sparge with a flow rate of 10 CFH at a constant pressure of 30 psi. Etching of the slugs was quenched by rising them with water.

The etching resulted in a specular surface suitable for visual inspection by high intensity lamp. The slugs displayed no significant surface stains, haze or other interference. Stacking faults were clearly visible on these slugs. The size, location and defect density of the OISF varied over the normal range for the product with an average defect count ranging from 4 to 10 defects/cm$^2$ and a standard deviation of 15. There were also slugs with unusually high counts due to poor preparation and some mild surface damage. These results are expected for slugs prepared without a polished surface. These results are also similar to those seen with chromic acid etching.

EXAMPLE 5

Using a 28 liter etch bath, 20 N+<100> slugs in the resistivity range of 0.011 to 0.020 ohm-cm were etched in 2 groups of 12 (10 slugs and two wafers) to simulate an actual wafer evaluation schedule. The four wafers were selected from ingots known to have high OISF from previous testing per the accepted method (ASTM F47 and DIN 50434) using chromic acid etchant. The OISF wafers were used as controls. The slugs were clean and damage-free per ASTM F47 and JEIDA JIS-H-0609. The slugs and wafers were subjected to an 1100 degree dry-wet-dry oxidation cycle necessary to generate OISF.

The etchant bath of Example 1 was employed and was activated by adding scrap silicon thereto to generate $NO_x$. This caused the temperature to rise and the slugs were etched for 2.5 minutes at 31° to 32° C. During etching, intense agitation was accomplished by a nitrogen sparge with a flow rate of 10 CFH at a constant pressure of 30 psi. Etching of the slugs was quenched by rinsing them with water.

The etching resulted in a nominal removal of 3.5 microns on both faces for a total change in slug thickness of 7 microns. The etching resulted in a specular surface suitable for visual inspection by high intensity lamp. The slugs displayed no significant surface stains, but haze was evident visually. The control wafers (known to be defective) displayed OISF visible under high intensity lamps. The test slugs had only 1 out of 10 with a swirl ring, a normal result for the N+ product. The size, location and defect density of the OISF varied over the normal range for the product and all were clearly discernible regardless of the variation. The average defect density seen for the wafers without swirl was 6 defects/cm$^2$ with a standard deviation of 12.5. The performance of the acid was comparable to results seen using chromic acid etchants.

EXAMPLE 6

Using a 28 liter etch bath, 64 P<100> and 64 N<100> wafers in the resistivity range of 8 to 14 ohm-cm were etched in two groups of 16 (8 N-type and 8 P-type) wafers on four consecutive days to simulate an actual wafer evaluation schedule. The wafers were first subjected to a low temperature nucleation cycle followed by an 1100 degree dry-wet-dry oxidation cycle to induce stacking faults. The wafers were prime wafers and by definition clean and damage-free.

The etchant bath of Example 1 was employed and was activated by adding scrap silicon thereto to generate $NO_x$. This caused the temperature to rise and the wafers were etched for 5 minutes at 31° to 32° C. During etching, intense agitation was provided by a nitrogen sparge with a flow rate of 10 CFH at a constant pressure of 30 psi while the wafers were rotated at 1 revolution per second.

The nominal removal was 1.5 microns on both faces for a total change in wafer thickness of 3 microns. The etching resulted in a specular surface suitable for visual inspection by high intensity lamp. The wafers displayed no significant surface stains, and haze (as measured by Tencor 5500) was <500 ppm. Most of the wafers displayed stacking faults visible under high intensity lamps and by microscope examination. The size, location, morphology, and OISF density of the wafers varied over the normal range for the product and all were clearly discernible regardless of the variation. Five wafers displayed metallic haze (S-pits) due to contamination and swirl was evident on 2 of the N<100> wafers. The low temperature nucleation step induced a range of stacking fault densities from 0 to 200 defects/cm$^2$. These results represent normal results typical of the product when heat treated in this manner. The results are comparable to those obtained with chromic acid etchants.

EXAMPLE 7

Using a 28 liter etch bath, 100 P<100> and 100 N<100> wafers in the resistivity range of 1 to 80 ohm-cm were etched in groups of 12 (5 N-type, 5 P-type and 2 controls) wafers in 20 consecutive runs to simulate a three day wafer evaluation schedule. Wafers which had been subjected to a low temperature nucleation cycle were included as controls wafers. The wafers were oxidized using an 1100 degree dry-wet-dry thermal cycle to induce stacking faults. The wafers were prime wafers and by definition clean and damage-free.

The etchant bath of Example 1 was employed and was activated by adding scrap silicon thereto to generate $NO_x$. This caused the temperature to rise and the wafers were etched for 5 minutes at 31° to 32° C. During etching, intense agitation was provided by a nitrogen sparge with a flow rate of 10 CFH at a constant pressure of 30 psi while the wafers were rotated at 1 revolution per second.

The nominal removal was 1.5 microns on both faces for a total change in wafer thickness of 3 microns. The etching resulted in a specular surface suitable for visual inspection by high intensity lamp. The wafers displayed no significant surface stains, and haze as measured by Tencor 5500 was <1000 ppm. Most of the wafers displayed stacking faults visible under high intensity lamps and under microscope examination. The size, location, morphology and OISF density of the wafers varied over the normal range of the product and all were clearly discernible regardless of the variation. 10 wafers displayed some level of metallic haze (S-pits) due to contamination, and swirl was evident on 1 of the N<100> wafers. The defect densities were typical for the product. The defect density averaged 4 defects/cm² with a standard deviation of 14. The control wafers all displayed stacking faults at levels seen in previous testing of pre-treated wafers. The results for this array of products were comparable to those obtained with chromic acid etchants, except that the etchant bath employed in this example more easily delineates the metallic haze.

EXAMPLE 8

Using a 28 liter etch bath, 100 P<111>EB and 100 P<111>EG wafers in the resistivity range of 1 to 30 ohm-cm were etched in groups of 12 (5 P<111>EB, 5 P<111>EG and 2 controls) wafers in 20 consecutive runs to simulate a three day wafer evaluation schedule. Wafers which had been subjected to a low temperature nucleation cycle were included as control wafers. The wafers were oxidized using an 1100 degree dry-wet-dry thermal cycle to induce stacking faults. The wafers were prime wafers and by definition clean and damage-free.

The etchant bath of Example 1 was employed and was activated by adding scrap silicon thereto to generate $NO_x$. This caused the temperature to rise and the wafers were etched for 5 minutes at 31° to 32° C. During etching, intense agitation was provided by a nitrogen sparge with a flow rate of 10 CFH at a constant pressure of 30 psi while the wafers were rotated at 1 revolution per second.

The nominal removal was 1.5 microns on both faces for a total change in wafer thickness of 3 microns. The etching resulted in a specular surface suitable for visual inspection by high intensity lamp. The wafers displayed no significant surface stains, and haze as measured by Tencor 5500 was <700 ppm on all the P<111>EG wafers, but comparable results were obtained for only 70% of the P<111>EB wafers. The remaining 30% of the P<111>EB wafers displayed metallic haze (S-pits) and Tencor haze readings exceeding 1500 ppm. This variation did not prevent accurate microscope evaluation however. Most of the wafers displayed stacking faults visible under high intensity lamps and under microscope examination. The control wafers displayed normal levels of OISF as expected. The size, location, morphology and OISF density of the test wafers varied over the normal range for the product and all were clearly discernible regardless of the variation. The defect densities were typical for the product. The OISF density averaged 2 defects/cm² with a standard deviation of 12. The S-pit density is estimated to have ranged from 500 to 100,000 defects/cm². All these results were expected. The control wafers all displayed stacking faults at levels seen in previous testing of pre-treated wafers. The results for this array of products were comparable to those obtained with chromic acid etchants, except that the etchant bath used in this example more easily delineates the metallic haze.

EXAMPLE 9

Using a 28 liter etch bath, 24 P+<100> and 24 N+<100> wafers in the resistivity range of 0.01 to 0.02 ohm-cm were etched in groups of 10 (4 N-type, 4 P-type and 2 controls) wafers in 6 consecutive runs to simulate a two day wafer evaluation schedule. Wafers which had been subjected to a low temperature nucleation cycle were included as control wafers. The wafers were oxidized using an 1100 degree dry-wet-dry thermal cycle to induce stacking faults. The wafers were prime wafers and by definition clean and damage-free.

The etchant bath of Example 1 was employed and was activated by adding scrap silicon thereto to generate $NO_x$. This caused the temperature to rise and the wafers were etched for 2.5 minutes at 31° to 32° C. During etching, intense agitation was provided by a nitrogen sparge with a flow rate of 10 CFH at a constant pressure of 30 psi while the wafers were rotated at 1 revolution per second.

The nominal removal was 3.5 microns on both faces for a total change in wafer thickness of 7 microns. The etching resulted in a specular surface suitable for visual inspection by high intensity lamp. The wafers displayed no significant surface stains, but haze as measured by Tencor 5500 was >1200 ppm on all wafers. Some of the wafers (30%) displayed stacking faults visible under high intensity lamps and by microscope examination. The size, location, morphology, and OISF density of the wafers varied over the normal range for the product and all were clearly discernible regardless of the variation. No swirl was seen on the test wafers, but was seen on some control wafers. The defect densities for the test wafers were typical for the product. The defect density averaged 2.5 defects/cm² with a standard deviation of 11. The control wafers all displayed stacking faults at levels seen in previous testing of pre-treated wafers. The results for this array of products were comparable to those obtained with chromic acid etchants. The high haze level necessitates counting the defects by microscope.

In view of the above, it will be seen that the several objects of the invention are achieved and other advantageous results attained.

As various changes could be made in the above process or method without departing from the scope of the invention, it is intended that all matter contained in the above description and shown in the accompanying drawings shall be interpreted as illustrative and not in a limiting sense.

What is claimed is:

1. A process for etching single crystal silicon semiconductor material of the N, P, N+ and P+ type selected from the group consisting of clean, damage-free slugs and wafers to delineate slip, lineage, dislocation, S-pit, twins, swirl and oxidation induced stacking fault defects which comprises the steps of:

a) preparing a substantially metal-free etchant bath comprising nitric acid (70%), hydrofluoric acid (49%) and between 35% to 98% by weight of glacial acetic acid (HAc) as a diluent, the minimum useful concentration of nitric acid being % Nitric acid$_{min.}$=16.67 (1-(% HAc/100)) and the maximum useful concentration of nitric acid being % Nitric acid$_{max.}$=66.67 (1-(% HAc/100)), the minimum useful concentration of hydrofluoric acid being % HF$_{min.}$=100%-% HAc-% HNO$_{3\ max.}$ and the maximum useful concentration of hydrofluoric acid being % HF$_{max.}$=100%-% HAc-HNO$_{3\ min.}$ b) activating said etchant bath by generating NO$_x$ therein and allowing the temperature of said bath to rise to approximately 25° to 34° C.

c) bringing said semiconductor material in a clean and damage-free condition into contact with said bath maintained at said temperature;

d) agitating said bath by bubbling an inert gas therethrough and maintaining said semiconductor material in contact with the resultant agitated bath and for a period of time sufficient to remove at least approximately 0.5 micron of silicon therefrom; and e) quenching the resultant etching of said semiconductor material by rinsing with water.

2. A process as set forth in claim 1 wherein the ratio of nitric acid to hydrofluoric acid in said etchant bath is defined by the formula:

$$\frac{wt.\ \%\ HF\ (49\%)}{wt.\ \%\ HNO_3\ (70\%)} = 1.333\ (\pm 0.2)$$

3. A process as set forth in claim 1 wherein the ratio of nitric acid to hydrofluoric acid in said etchant bath is defined by the formula:

$$\frac{wt.\ \%\ HF\ (49\%)}{wt.\ \%\ HNO_3\ (70\%)} = 2.041\ (\pm 0.2)$$

4. A process as set forth in claim 1 wherein said etchant bath has the following composition:

| | |
|---|---|
| Hydrofluoric acid (49%) | 20 wt. % (±0.5) |
| Nitric acid (70%) | 20 wt. % (±1.0) |
| Glacial acetic acid | 60 wt. % (±1.0) |

5. A process as set forth in claim 1 wherein said etchant bath has the following composition:

| | |
|---|---|
| Hydrofluoric acid (49%) | 26.847 wt. % (±0.5) |
| Nitric acid (70%) | 13.153 wt. % (±1.0) |
| Glacial acetic acid | 60.000 wt. % (±1.0) |

6. A process as set forth in claim 1 wherein said etchant bath is activated in step b) by the addition of scrap silicon thereto.

7. A process as set forth in claim 1 wherein said etchant bath is activated in step b) by the addition of a source of nitrate ions thereto.

8. A process as set forth in claim 1 wherein said inert gas is bubbled through said bath in step d) at a rate of 5–20 CFH at a constant pressure of 15–30 psi.

9. A process as set forth in claim 1 wherein said semiconductor material is constituted by said slugs and the temperature of said bath in step b) is approximately 31°–32° C.

10. A process as set forth in claim 9 wherein the defect delineated is swirl and the time required in step d) is approximately 5 minutes.

11. A process as set forth in claim 9 wherein the defect delineated is oxidation induced stacking fault and the time required in step d) is approximately 2.5 minutes.

12. A process as set forth in claim 1 wherein said semiconductor material is constituted by wafers and said removal in step d) is at least 1.5 microns of silicon therefrom.

* * * * *